United States Patent
Birkbak et al.

(10) Patent No.: US 12,035,480 B1
(45) Date of Patent: Jul. 9, 2024

(54) RECYCLING PRINTED CIRCUIT BOARDS USING SWELLING AGENT

(71) Applicant: Vestas Wind Systems A/S, Aarhus N (DK)

(72) Inventors: Mie Elholm Birkbak, Sabro (DK); Jesper Rømer Hansen, Risskov (DK)

(73) Assignee: Vestas Wind Systems A/S, Aarhus N. (DK)

( * ) Notice: Subject to any disclaimer, the term of this patent is extended or adjusted under 35 U.S.C. 154(b) by 0 days.

(21) Appl. No.: 18/222,127

(22) Filed: Jul. 14, 2023

(30) Foreign Application Priority Data

Jan. 31, 2023 (DK) ............... PA 2023 70053

(51) Int. Cl.
*H05K 3/00* (2006.01)
*B03C 1/18* (2006.01)
*B03C 1/247* (2006.01)

(52) U.S. Cl.
CPC .............. *H05K 3/0011* (2013.01); *B03C 1/18* (2013.01); *B03C 1/247* (2013.01); *B03C 2201/20* (2013.01); *H05K 2203/178* (2013.01)

(58) Field of Classification Search
CPC .. B03C 1/18; B03C 1/20; B03C 1/247; H05K 3/0011; H05K 2203/178
See application file for complete search history.

(56) References Cited

U.S. PATENT DOCUMENTS

| | | | |
|---|---|---|---|
| 8,138,437 B2 * | 3/2012 | Valerio | C22B 7/005 324/207.16 |
| 2005/0258178 A1 | 11/2005 | Howarth et al. | |
| 2007/0169330 A1 * | 7/2007 | Wu | C22B 7/001 29/403.3 |

FOREIGN PATENT DOCUMENTS

| | | |
|---|---|---|
| CN | 101270411 A | 9/2008 |
| CN | 103540748 A | 1/2014 |
| CN | 104672488 A | 6/2015 |
| CN | 105524434 A | 4/2016 |
| CN | 208114437 U | 11/2018 |
| CN | 110496846 A | 11/2019 |
| CN | 110757682 A | 2/2020 |
| CN | 109897216 B | 2/2021 |

(Continued)

OTHER PUBLICATIONS

Danish Patent and Trademark Office, 1st technical examinaton report issued in corresponding DK Application No. PA 2023 70053, dated Jun. 23, 2023.

(Continued)

*Primary Examiner* — Michael McCullough
*Assistant Examiner* — Kalyanavenkateshware Kumar
(74) *Attorney, Agent, or Firm* — Wood Herron & Evans LLP

(57) ABSTRACT

Methods and systems for recycling a printed circuit board (PCB). The printed circuit board is exposed to a swelling agent that causes an epoxy matrix of the printed circuit board to swell and disintegrate into particles. The particles of epoxy are then separated from the printed circuit board, leaving behind reinforcing fiber and metal containing components thereof. These remaining components are separated from each other and recycled separately using suitable processes. The epoxy particles are also recovered, and may be reduced to a monomer for use in synthesizing new epoxy. The swelling agent includes a carboxylic acid, preferably formic acid, as an active ingredient.

19 Claims, 3 Drawing Sheets

(56) References Cited

FOREIGN PATENT DOCUMENTS

| | | |
|---|---|---|
| CN | 113248781 A | 8/2021 |
| GB | 1382825 A | 2/1975 |
| JP | H10314713 A | 12/1998 |
| JP | 2002119404 A | 4/2002 |
| WO | WO-2022123438 A1 * | 6/2022 ............... B09B 3/80 |

OTHER PUBLICATIONS

International Searching Authority, International Search Report and Written Opinion issued in corresponding PCT Application No. PCT'DK2024'050017, dated May 14, 2024.

* cited by examiner

RECYCLING PRINTED CIRCUIT BOARDS USING SWELLING AGENT

TECHNICAL FIELD

This invention relates generally to the recycling of composite materials, and more particularly to the use of a swelling agent that breaks down an epoxy portion of a composite material to facilitate recovery of component materials from a printed circuit board.

BACKGROUND

Consumer electronics, such as televisions, computers, and smart phones, continue to become more and more ubiquitous worldwide, with the average person in most developed countries owning multiple devices. Due to the rapid development of technology in this area, these devices tend to become obsolete over a relatively short period of time. Thus, consumer electronic devices are constantly being replaced. This constant cycle of replacement produces a significant and ever-increasing amount of electronic waste (e-waste). Printed circuit boards are a major component of this e-waste because they are used in most if not all electronic devices manufactured today. Printed circuit boards are generally designed to work only in their respective electronic devices, and typically have no practical use outside of the electrical device in which they are originally installed.

A printed circuit board includes a laminated structure having alternate conductive and insulating layers. Each of the conductive layers includes a pattern of conductive traces configured to connect electrical components attached to the printed circuit board in a predefined manner, and has a copper layer from which the traces are formed. The insulating layers are typically formed from an epoxy matrix of cross-linked polyepoxides embedded with reinforcing glass fibers. Although printed circuit boards may have any number of layers, one common printed circuit board configuration known as "four layer board" includes three insulating layers alternating with four (two external and two internal) conductive layers. The epoxy matrix bonds the glass fibers of the printed circuit board together, and provides a durable substrate for mounting electrical components. However, this durability also makes it difficult to recycle the materials from which the printed circuit board is made once the electronic device has been discarded.

Conventional attempts at recycling printed circuit boards include mechanical, chemical, and thermal approaches. Mechanical methods involve the grinding of the printed circuit board into small pieces followed by separation of the pieces into different material streams. However, grinding is only effective at liberating the substrate from the metal containing portions, typically generates toxic gases and dust, and does not result in high recovery rates for the most valuable components, e.g., precious metals. Chemical methods typically generate copious amounts waste products that must be disposed of as hazardous waste, thereby potentially creating a larger environmental problem than they solve. Thermal methods involve thermal decomposition of printed circuit boards at elevated temperatures. However, the pyrolytic processing of printed circuit boards generates hazardous chemicals from the thermal degradation of epoxy and volatilization of metals, and consumes substantial amounts of energy. Due to the disadvantages of known methods of recycling printed circuit boards, printed circuit boards are often simply thrown away.

Thus, there is a need for improved methods and systems for recycling printed circuit boards.

SUMMARY

In an aspect of the invention, a method of processing a printed circuit board including an epoxy-based composite material is disclosed. The method includes exposing the printed circuit board to a swelling agent including an effective amount of at least one of formic acid, acetic acid, and propionic acid. The printed circuit board is exposed to the swelling agent until the epoxy has swollen sufficiently to disintegrate into swelled epoxy particles. The swelled epoxy particles are then separated from a remaining portion of the printed circuit board.

In an embodiment of the method, separating the epoxy particles from the remaining portion of the printed circuit board may include vibrating the printed circuit board. For example, the printed circuit board may be vibrated proximate to a sieve screen configured to allow the swelled particles of epoxy to fall through and to retain at least a part of the remaining portion of the printed circuit board.

In another embodiment of the method, at least a portion of the swelled epoxy particles may be suspended in the swelling agent, and separating the swelled epoxy particles from the remaining portion of the printed circuit board may include filtering the particles from the swelling agent.

In another embodiment of the method, the method may further include comminuting the printed circuit board into a plurality of pieces. Comminuting the printed circuit board into the plurality of pieces may include, for example, one or more of cutting, grinding, or pulverizing the printed circuit board. When the comminuting occurs prior to exposure to the swelling agent, the printed circuit board may be exposed to the swelling agent by immersing the plurality of pieces in the swelling agent.

In another embodiment of the method, the method may further include, after the epoxy has disintegrated, removing the swelling agent, washing the printed circuit board, and drying the printed circuit board. Removing the swelling agent may include draining the swelling agent from a processing chamber containing the printed circuit board, filtering the swelling agent, and returning the swelling agent to a swelling agent tank used to supply the swelling agent to the processing chamber.

In another embodiment of the method, exposing the printed circuit board to the swelling agent may include one or more of heating the swelling agent, pressurizing the swelling agent, and agitating the swelling agent. The swelling agent may also include one or more of a solvent, a surfactant, and a complexing agent.

In another embodiment of the method, the method may further include extracting glass fibers from the remaining portion of the printed circuit board. Extracting the glass fibers may include, for example, inserting a multi-pronged tool into the remaining portion of the printed circuit board and rotating the tool.

In another embodiment of the method, the method may further include extracting a metal from the remaining portion of the printed circuit board. The metal extracted may include a base metal, and extracting the base metal from the remaining portion of the printed circuit board may include exposing the printed circuit board to a general acid and extracting the base metal from the general acid. The general acid may include one or more of hydrochloric acid, nitric acid, sulfuric acid, and phosphoric acid.

In another embodiment of the method, the metal extracted from the remaining portion of the printed circuit board may include a noble metal, and extracting the noble metal may include exposing the printed circuit board to a noble metal solution and extracting the noble metal from the noble metal solution. The noble metal solution may include one of an aqua regia or a cyanide salt solution.

In another embodiment of the method, extracting the metal from the remaining portion of the printed circuit board may include exposing the printed circuit board to an eddy current separator configured to separate a first metal from a second metal.

In another embodiment of the method, extracting the metal from the remaining portion of the printed circuit board may include extracting the metal from the swelling agent. For example, the metal may be extracted from at least one of the formic acid, the acetic acid, and the propionic acid of the swelling agent.

In another embodiment of the method, the swelling agent may include formic acid in a concentration of at least 20% by volume.

In another aspect of the invention, a system for processing a printed circuit board according to any of the above methods is disclosed.

The above summary presents a simplified overview of some embodiments of the invention to provide a basic understanding of certain aspects of the invention discussed herein. The summary is not intended to provide an extensive overview of the invention, nor is it intended to identify any key or critical elements, or delineate the scope of the invention. The sole purpose of the summary is merely to present some concepts in a simplified form as an introduction to the detailed description presented below.

BRIEF DESCRIPTION OF THE DRAWINGS

The accompanying drawings, which are incorporated in and constitute a part of this specification, illustrate various embodiments of the invention and, together with the general description of the invention given above, and the detailed description of the embodiments given below, serve to explain the embodiments of the invention.

It should be understood that the appended drawings are not necessarily to scale, and may present a somewhat simplified representation of various features illustrative of the basic principles of the invention. The specific design features of the sequence of operations as disclosed herein, including, for example, specific dimensions, orientations, locations, and shapes of various illustrated components, may be determined in part by the particular intended application and use environment. Certain features of the illustrated embodiments may have been enlarged or distorted relative to others to facilitate visualization and a clear understanding.

DETAILED DESCRIPTION

Embodiments of the invention are directed to methods and systems for recycling printed circuit boards. The printed circuit boards are exposed to a swelling agent that causes the epoxy matrix of the printed circuit board to swell. Swelling occurs as the swelling agent diffuses into the epoxy, thereby increasing the volume of the epoxy matrix. As the epoxy swells, the resulting mechanical stresses cause the epoxy to disintegrate into epoxy particles. The particles of epoxy can then be separated from the reinforcing fibers (e.g., glass fiber) and other components of the printed circuit board, and the separated components recycled. This includes the epoxy, the reinforcing fibers, copper, and any number of other metals used in the manufacturing of the printed circuit board. The swelling agent includes a carboxylic acid, preferably formic acid, as an active ingredient that causes the epoxy to swell. Advantageously, because the carboxylic acid is not consumed in any significant amount by the process of disintegration, the swelling agent can be easily recycled for use in processing additional printed circuit boards.

Figure 1:
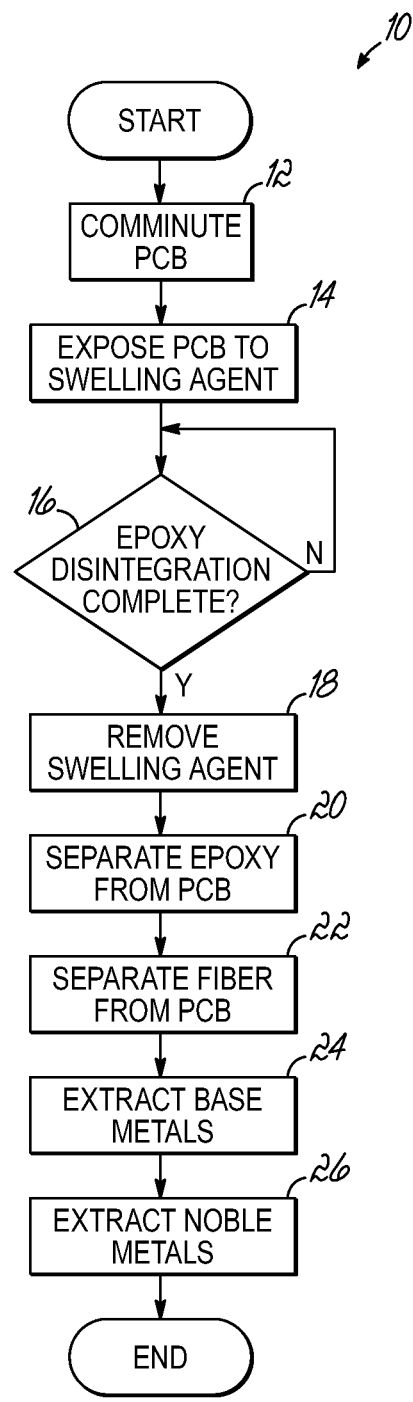
FIG. 1 is a flowchart depicting an exemplary process for recycling a printed circuit board.

FIG. 1 illustrates an exemplary process 10 for recycling printed circuit boards in accordance with an embodiment of the invention. In block 12, the process 10 comminutes the printed circuit board by cutting, grinding, pulverizing, or otherwise fragmenting the printed circuit board into pieces. The resulting pieces may be in the form of strips, chips (e.g., squares), or granules of the printed circuit board. The pieces may have one or more dimensions (e.g., a length, a width, or both a length and a width) that are less than a predetermined length, e.g., less than 50 mm, preferably between 5 mm and 20 mm, and more preferably about 10 mm. The size of the pieces may be selected so that they are small enough for the epoxy matrix to be quickly disintegrated by the swelling agent, but large enough so that their non-epoxy components (e.g., reinforcing fiber and metal containing components) can be easily separated from the disintegrated particles of epoxy, as described in more detail below.

In an alternative embodiment of the invention, the comminution step may be skipped. The comminution step may be skipped, for example, if the printed circuit boards being recycled are small, the components of the printed circuit board are of a nature such that they would be more easily sorted if the boards were left intact, or to reduce the complexity of the recycling process.

In block 14, the process 10 exposes the printed circuit board or the pieces thereof (referred to collectively hereinafter as simply the printed circuit board) to a swelling agent. Exposing the printed circuit board to the swelling agent may include applying the swelling agent such that the surfaces of the circuit board are wetted. Wetting may be accomplished, for example, by placing the printed circuit board in a processing chamber, and providing an amount of the swelling agent to the chamber sufficient to submerge the printed circuit board. The swelling agent may also be applied by scattering or spraying droplets of the swelling agent on the printed circuit board. The application of swelling agent in this manner may be continuous or intermittent, with periods between applications being short enough to prevent the wetted surfaces of the printed circuit board from becoming dry.

The swelling agent is configured to cause swelling of the epoxy portion of the printed circuit board. To this end, the swelling agent includes a carboxylic acid, preferably formic acid. The swelling agent may comprise, for example, an aqueous solution of carboxylic acid having a concentration of at least 20% by mass, and more preferably at least 50% by mass. In some embodiments, the swelling agent may be provided at a concentration of 100% carboxylic acid. Swelling agents having higher concentrations of carboxylic acid may cause the swelling of epoxy to occur at a higher rate, thereby reducing the amount of time it takes to disintegrate the epoxy. For a given carboxylic acid, the speed at which the epoxy matrix fragments increases with the concentration of the carboxylic acid in the swelling agent.

Carboxylic acids are organic acids that contain a carboxyl group (C(=O)OH) attached to an R— group. The general formula of a carboxylic acid is R—COOH, with R referring to an alkyl, alkenyl, aryl, or other group. Carboxylic acids include, in addition to the aforementioned formic acid, acetic acid, propionic acid, butyric acid, valeric acid, caproic acid, enanthic acid, caprylic acid, pelargonic acid, capric acid, undecylic acid, lauric acid, tridecylic acid, myristic acid, pentaldecylic acid, palmitic acid, lauric acid, tridecylic acid, myristic acid, pentadecylic acid, palmitic acid, margaric acid, stearic acid, nonadecylic acid, and arachidic acid.

What constitutes an effective amount of carboxylic acid in a swelling agent may vary considerably depending on the type of carboxylic acid being used as the active ingredient and the conditions under which the epoxy matrix is being exposed to the swelling agent. A swelling agent may be considered to have an effective amount of the selected carboxylic acid if the concentration of the carboxylic acid is sufficient to cause at least 50% of the epoxy matrix to disintegrate under the selected set of exposure conditions. Exposure conditions that affect the rate at which the epoxy matrix disintegrates may include the size, shape, and type of epoxy matrix being disintegrated, as well as the duration, temperature, pressure, and agitation associated with the exposure to the swelling agent.

By way of example, an effective amount of acetic acid may be about 75% concentration by volume for a 100 gram sample of clear epoxy exposed to the swelling agent for 250 hours at 20° C. and one atmosphere without agitation. By way of another example, an effective amount of formic acid may be about 75% concentration by volume for the same sample exposed to the swelling agent for 24 hours at the same temperature and pressure without agitation. In contrast, the effective amount of formic acid would only be about 20% concentration by volume for the same sample exposed to the swelling agent for 62 hours the same temperature and pressure without agitation. Because the rate of disintegration for given epoxy matrix generally scales with exposure conditions, and these conditions are easily replicated, an effective amount of a selected carboxylic acid for any given set of exposure conditions can be readily determined without undue experimentation.

In addition to carboxylic acid, the swelling agent may include components such as other organic or inorganic acids, solvents, dissolved salts, surfactants, and complexing agents. Exemplary organic acids that may be added to the swelling agent include trifluoroacetic acid, trichloroacetic acid, methanesulfonic acid, trifluoromethanesulfonic acid, performic acid, lactic acid, and oxalic acid, as well as an anhydride of any of these acids. Exemplary inorganic acids that may be added include hydrochloric acid, nitric acid, sulfuric acid, phosphoric acid, boric acid, and hydrobromic acid.

Exemplary solvents that may be added to the swelling agent include alcohol, e.g., methanol, ethanol, propanol, isopropanol, butanol, t-butanol, and/or amyl alcohol. In principle any alcohol dissolvable in the swelling agent may be added. When using alcohol as an additional component to a swelling agent comprising formic acid, a potential esterification of the formic acid may occur.

Other solvents that may be added to the swelling agent include tetrahydrofuran (THF), dimethylformamide (DMF), N-Methyl-2-pyrrolidone (NMP), dimethyl sulfoxide (DMSO), dichloromethane, chloroform, acetone, acetonitrile, chlorobenzene, diethylether, dioxane, ethylene glycol, polyethylene glycol (PEG), glycerin, hexamethylphosphoramide (HMPA), nitromethane, pyridine, trimethylamine, toluene, xylene, benzene, dimethylacetamide (DMAc), dimethoxyethane (DME), diglyme, and dichloroethan. Swelling agents including solvents may be one-phase or two-phase systems. One-phase systems may further comprise an emulsifier to stabilize the one-phase system.

Dissolved salts that may be added to the swelling agent include $NaCl$, $KCl$, $CsCl$, $NaHCO_3$, $KHCO_3$, $CsHCO_3$, $Na_2CO_3$, $K_2CO_3$, $CS_2CO_3$, any salt comprising a quaternary ammonium cation, and any salt comprising either a tetrafluoroborate anion or hexafluorophosphate anion. Including a salt in the swelling agent may modify the solubility of certain materials in the swelling agent. For example, for swelling agents comprising an aqueous solution of carboxylic acid, the addition of salt may alter a hydrophobic effect of the swelling agent. Adding salt to the swelling agent may also reduce the risk of disintegrating components other than epoxy, thereby preventing components such as reinforcing fibers and metal containing elements from being disintegrated into small pieces that would be difficult to separate from the epoxy particles.

Exemplary surfactants that may be included in the swelling agent include anionic and non-ionic surfactants, such as sulfates, sulfonates, gluconate, cocamide, ethoxylates, and alkoxylates. Adding a surfactant may be advantageous where the swelling agent is an aqueous solution, and the printed circuit board is fully or partly covered by a hydrophobic coating material, or includes one or more internal layers having hydrophobic coatings. Also soap and other emulsifiers may be included in the swelling agent.

The type and amount of any additional components added to the swelling agent may be selected based on the materials being recovered from the printed circuit board. For example, additional components may be selected to prevent materials other than the epoxy from being dissolved or disintegrated by the swelling agent, e.g., by adjusting the pH of the swelling agent.

Complexing agents may facilitate dissolution of one or more metals into the swelling agent, thereby facilitating recovery of the dissolved metal from the swelling agent.

The swelling agent may be provided at ambient temperature (e.g., 20-25° C.) or at an elevated temperature (e.g., 25-100° C.). Heating the swelling agent to an elevated temperature may accelerate the swelling process at the expense of increased energy consumption and evaporation of the swelling agent. In particular, the swelling agent may be heated to 50-95° C. to accelerate the swelling process. When elevated temperatures are used, the swelling agent may be maintained at the elevated temperature during the entire swelling process, or the swelling agent may be allowed to gradually cool toward the end of the swelling process. The swelling agent may also be agitated, e.g., by circulating the swelling agent, introducing acoustical energy (e.g., ultrasonic energy) into the swelling agent, rocking or swirling the processing chamber, bubbling air through the swelling agent, etc. Agitating the swelling agent may facilitate penetration of the swelling agent into the epoxy and/or release swelled epoxy particles from the printed circuit board.

Exposing the printed circuit board to the swelling agent at atmospheric pressure has the advantage of not requiring the processing chamber to be airtight or structurally reinforced to withstand pressure. For example, unpressurized processing chambers may be open or otherwise unsealed containers. In an alternative embodiment, the printed circuit board may be exposed to the swelling agent under pressure, e.g., at between one and three atmospheres.

Exposing the printed circuit board to the swelling agent under pressure may accelerate diffusion of the swelling agent into the epoxy matrix, and may also allow higher temperatures (e.g., 100-200° C.) without boiling the swelling agent. Elevated pressures may be generated, for example, by placing the printed circuit board and swelling agent into a sealed processing chamber, and then raising the temperature in the processing chamber until the desired temperature and pressure are reached.

Heating, agitation, and pressurization of the swelling agent may be used independently or in conjunction to control the speed of the swelling process. The rate of the swelling process may be controlled to reduce the amount of time it takes to disintegrate the epoxy. The rate of the swelling process may also be controlled to adjust the size of the epoxy particles into which the epoxy disintegrates. Agitation of the swelling agent may be kept low or avoided entirely to keep the printed circuit board relatively intact, or provided at a relatively high level to separate the epoxy particles from the printed circuit board by suspending them in the swelling agent. In cases where the epoxy particles are suspended in the swelling agent, they may be recovered for recycling by filtering or centrifuging the swelling agent.

The amount of time the printed circuit board is exposed to the swelling agent to achieve full disintegration of the epoxy matrix may vary widely depending on the exposure conditions.

Printed circuit boards passively soaked in swelling agents having a relatively low concentration (e.g., less than 20%) of carboxylic acid at ambient temperature and pressure may take a relatively long time (e.g., 144 hours or more) to completely disintegrate. Raising the concentration, temperature, pressure, or level of agitation may reduce this time considerably, e.g., to less than an hour. The exposure time may also depend on the properties of the printed circuit board, such as the type of epoxy matrix, the degree of crosslinking of the epoxy matrix, and the size and shape of the printed circuit board or pieces thereof.

In block 16, the process 10 may determine if the epoxy matrix of the printed circuit board has disintegrated sufficiently to allow separation of the epoxy from the remaining portions of the printed circuit board. The level of disintegration of the epoxy may be determined visually, based on an amount of time and a known rate of disintegration, by measuring a turbidity of the swelling agent in the processing chamber, or using any other suitable means. If the epoxy has not been sufficiently disintegrated ("NO" branch of decision block 16), the process 10 may continue to expose the printed circuit board to the swelling agent. If the epoxy has been sufficiently disintegrated ("YES" branch of decision block 16), the process 10 may proceed to block 18.

In block 18, the process 10 may remove the swelling agent from the printed circuit board, or what remains thereof. Removal of the swelling agent may include one or more of draining the swelling agent from the processing chamber, flushing the processing chamber with a cleaning agent, and drying the printed circuit board (e.g., by circulating air through the chamber). The cleaning agent may include water, for example, and may also include a surfactant, such as a non-foaming detergent.

Once the swelling agent has been removed from the printed circuit board, the process 10 may proceed to block 20 and separate the epoxy from the remaining components of the printed circuit board. In cases where the epoxy was separated from the printed circuit board while it was being exposed to the swelling agent, or by subsequent cleaning/flushing steps, the process may skip block 20 and proceed directly to block 22.

In block 20, the process 10 may separate the disintegrated epoxy from the remainder of the printed circuit board. Separating the disintegrated epoxy may include vibrating, deforming, or otherwise agitating the printed circuit board. The printed circuit board may be agitated, for example, over a sieve screen configured to catch the reinforcing fiber and electrical components of the printed circuit board and allow the particles of epoxy to fall through. Compressed air may also be used to separate the epoxy particles from the other components of the printed circuit board. e.g., by blowing the particles of epoxy off the printed circuit board.

As described above, the epoxy particles may also be separated using a wet process that suspends and carries the particles away from the remaining portion of the printed circuit board. This step may be performed as a separate step, or while removing the swelling agent, which may carry with it a slurry of epoxy particles. The swelling agent may be withdrawn from the processing chamber through a filter with a relatively large pore size to allow the epoxy particles to pass through with the swelling agent to obtain the slurry, while holding back the other components of the printed circuit board.

Subsequent washing stages in which the cleaning agent is flushed through the processing chamber may also be used to separate epoxy particles from the remaining components of the printed circuit board. The cleaning agent may include a surfactant, such as an anionic surfactant and/or an amphiphilic surfactant, e.g., a quaternary ammonium surfactant. The surfactant may reduce surface tension, thereby increasing the wetting properties of the cleaning agent and thus its effectiveness at separating the epoxy particles from the remaining components of the printed circuit board. In any case, once liberated, the particles of epoxy may be captured and subjected to further processing, such as reduction into a monomer (e.g., Bisphenol A (BPA)) that can be used to produce new epoxy resin.

Separating the particles of epoxy from the other components of the printed circuit board may also include mechanically removing particles of epoxy, e.g., by scraping, combing, or any other suitable mechanical action. Mechanical removal may be performed prior to a washing or process. In alternative embodiments, a washing or flushing process may be performed after or simultaneously with the mechanical removal of the particles of epoxy from the other components of the printed circuit board.

Any slurry or suspension of epoxy particles obtained in the above manner may be added to any slurries or suspensions of epoxy particles obtained during previous or subsequent steps. The combined suspension/slurry may then be further processed to extract the epoxy particles, e.g., by filtration, centrifugation, or any other suitable means. The filtered swelling agent may be kept separate from washing and flushing fluids so that it can be recirculated to process additional printed circuit boards. The concentration of the carboxylic acid in the swelling agent may be adjusted as part of this recycling process. For example, because carboxylic acids tend to absorb moisture from the air and other sources and may also break down into water and carbon monoxide, additional carboxylic acid may be added to the swelling agent to maintain the concentration at desired levels.

In block 22, the reinforcing fiber (e.g., glass fiber) may be separated from the remaining portion of the printed circuit board based on their substantially different physical characteristics, e.g., shape, size, conductivity, magnetic permeability, and density. For example, the reinforcing fibers may be pulled from the remaining components using a combing process similar to that of a cotton gin, by inserting a multi-pronged tool into the reinforcing fibers and rotating the tool, using a vibrational separator, an air table, or any other suitable means. The reinforcing fiber may then be recycled, e.g., by melting down in the case of glass fibers, or by cleaning and reusing the reinforcing fibers directly.

After the reinforcing fiber portion of the printed circuit has been separated, the remaining portion of the printed circuit board may consist primarily of metal containing components, e.g., copper traces, solder, gold contacts, etc. Accordingly, the process 10 may proceed to block 24 and extract base metals from this remaining portion of the printed circuit board. Base metals may be extracted using electronic, mechanical, or chemical means based on differences in their physical or chemical characteristics. For example, ferrous and other magnetic metals may be separated using a magnetic separator. The remaining metals can then be passed through an eddy current separator to separate light metals (e.g., aluminum) from heavier metals (e.g., copper) based on differences in their densities and conductivities.

Depending on the separation process used, the remaining portion of the printed circuit board may be subjected to further comminute stages to further reduce and standardize the size of the particles being separated. These particles may be sorted by size and passed through one or more electrostatic separators, for example. Chemical separation of base metals may be performed by selectively exposing the metals to one or more general acid solutions (e.g., hydrochloric acid, nitric acid, sulfuric acid, or phosphoric acid) configured to react with a particular metal or set of metals and dissolve the resulting salt or salts. The general acid solution may then be drained and saved for later processing to recover the dissolved metal salt.

In block 26, the process may extract noble metals (e.g., gold and platinum). Noble metals may be extracted chemically, e.g., by exposing the remaining portions of the printed circuit board to a noble metal solution consisting of an aqua regia or a cyanide salt solution. After the noble metal solution has extracted the noble metals, it may be drained and saved for later processing to recover the noble metals.

Figure 2:
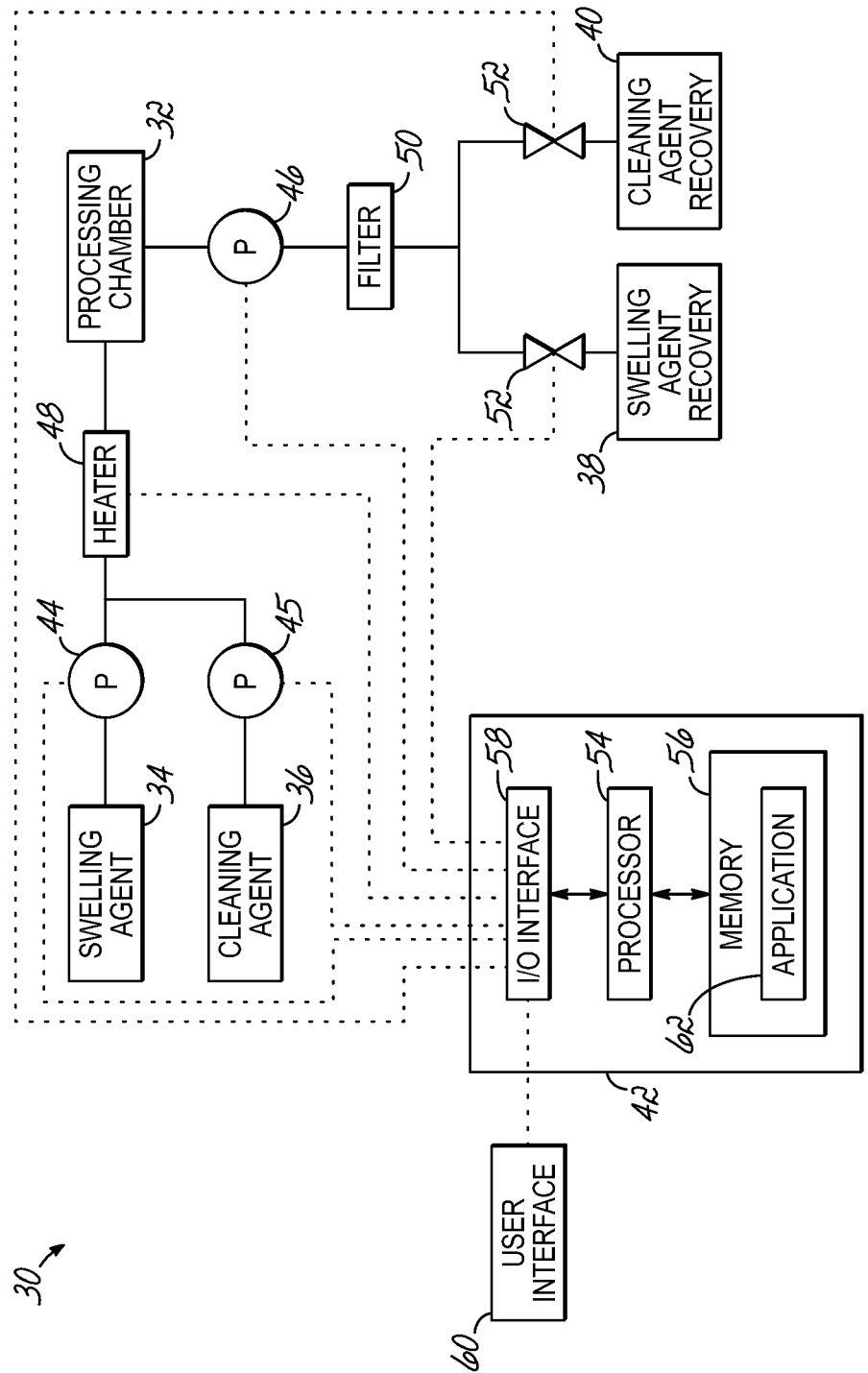
FIG. 2 is a diagrammatic view of an exemplary system for performing at least a portion of the process of FIG. 1.

FIG. 2 illustrates an exemplary system 30 for recycling printed circuit boards. The system 30 includes a processing chamber 32, a source of swelling agent 34, a source of cleaning agent 36, a swelling agent recovery tank 38, a cleaning agent recovery tank 40, and a controller 42. The processing chamber 32 may be operatively coupled to the source of swelling agent 34 and the source of cleaning agent 36 by respective source pumps 44, 45 and a heater 48. Each source pump 44, 45 may be configured to provide the swelling agent or cleaning agent, respectively, in response to signals from the controller 42. The source pumps 44, 45 may also be configured to provide their respective agents to the processing chamber 32 under pressure, e.g., to support pressurized processing of the printed circuit boards. The heater 48 may be selectively activated by the controller 42 to heat the swelling or cleaning agent as the agent flows though the heater 48 to the processing chamber 32.

The processing chamber 32 may be further operatively coupled to the swelling agent recovery tank 38 and cleaning agent recovery tank 40 by a drain pump 46, a filter 50, and a plurality of valves 52. The drain pump 46 may be configured to draw liquids, such as the swelling agent or cleaning agent, from the processing chamber 32 in response to signals from the controller 42. The controller 42 may selectively open and close the valves 52 so that the fluid being drawn from the processing chamber flows into the correct agent recovery tank.

The controller 42 may include a processor 54, a memory 56, an input/output (I/O) interface 58, and a user interface 60. The processor 54 may include one or more devices that manipulate signals based on operational instructions which are stored in memory 56 as an application 62 and that are executed by the processor 54. The I/O interface 58 may provide a machine interface that operatively couples the processor 54 to other devices and systems, such as the pumps 44-46, heater 48, and valves 52. The application 62 may thereby control the system 30. The user interface 60 may be operatively coupled to the processor 54 of controller 42 to allow a user to interact directly with the controller 42. To this end, the user interface 60 may include output devices capable of providing data to the user, and input devices capable of accepting input from the user.

Figure 3:
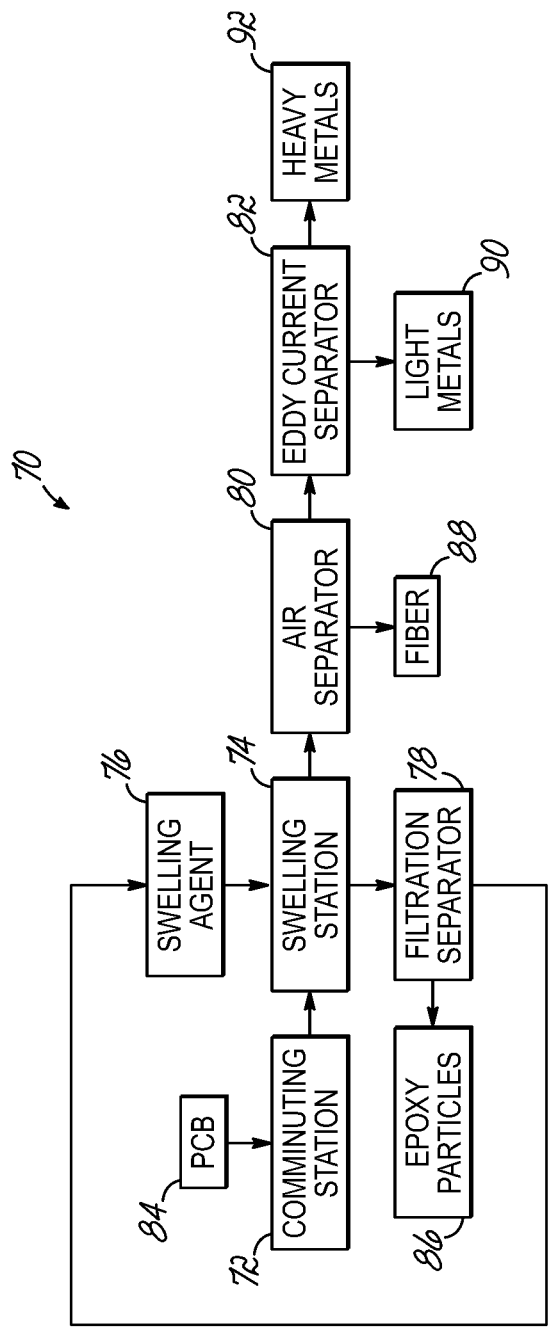
FIG. 3 is a diagrammatic view of another exemplary system for performing at least a portion of the process of FIG. 1.

FIG. 3 illustrates another exemplary system 70 for recycling printed circuit boards. The system 70 includes a comminuting station 72, a swelling station 74, a source of swelling agent 76, a filtration separator 78, an air separator 80, and an eddy current separator 82. Printed circuit boards 84 may be initially provided to the comminuting station 72 where they are divided (e.g., cut) into pieces having a generally consistent size, e.g., 10 mm square. The pieces of printed circuit board may then be provided to the swelling station 74 where they are exposed to the swelling agent 76.

The pieces of printed circuit board may be exposed to the swelling agent 76 for a predetermined period of time known to allow for the full disintegration of the epoxy matrix of the pieces printed circuit board. In an alternative embodiment, the amount of time the pieces of printed circuit board are exposed to the swelling agent 76 may be controlled based on observations of the state of the pieces, or based on sensor data. For at least a portion of the time the pieces of printed circuit board are being exposed to the swelling agent 76, the swelling agent 76 may be circulated with sufficient force to dislodge the decomposed particles of epoxy. The dislodged particles of epoxy may then be flushed into the filtration separator 78 by the swelling agent 76. The filtration separator 78 may separate the particles of epoxy from the swelling agent 76 so that the epoxy particles 86 can be recovered for further treatment, e.g., reduction to a monomer at an off-site chemical treatment plant, and preferably recycled. The filtered swelling agent 76 may be returned to the source of swelling agent 76 for reuse.

After the epoxy has been sufficiently removed from the printed circuit board, the remaining components thereof (e.g., reinforcing fiber and metal containing parts) may be provided to a separator chamber of air separator 80. Air may be circulated through the separator chamber to separate lighter materials (e.g., the reinforcing fibers 88) from heavier materials (e.g., the metal containing components). An amount of air flow required for separation may be blown upward through the separation chamber. This air flow may be configured to carry the lighter components upward where they are collected in a top portion of the chamber, e.g., by a cyclone. The flow of air may at the same time be insufficient to support the heavier components. Thus, the heavier components may fall downward and be collected in a bottom portion of the chamber. The collected reinforcing fiber 88 may then be recycled or reused, and the heavier materials provided to the eddy current separator 82.

The eddy current separator 82 may include a belt that carries particles of different metals and a magnetic drum. The magnetic drum may rotate at high speed, e.g., 4,000

RPM. The belt and magnetic drum may be configured to provide relative motion between the metallic particles and the magnetic drum such that magnetic lines of force pass through the particles. The magnetic lines of force may induce currents in the particles in proportion to their conductivity. The interactions between the induced currents and the magnetic fields may affect the trajectories of the particles as they fall off the belt. The resulting trajectories may be different based on both the relative conductivity and mass of the particles such that lighter and more conductive particles (i.e., light metals 90) are collected in one bin, and heavier and less conductive particles (i.e., heavy metals 92) are collected in another bin. The sorted metal particles may then be further processed using chemicals, electroplating, or other suitable means to recover each type of metal for reuse.

In general, the routines executed to implement the embodiments of the invention may be referred to herein as "computer program code," or simply "program code." Program code typically comprises computer-readable instructions that are resident at various times in various memory and storage devices in a computer and that, when read and executed by one or more processors in a computer, cause that computer to perform the operations necessary to execute operations or elements embodying the various aspects of the embodiments of the invention.

In certain alternative embodiments, the functions, acts, or operations specified in the flowcharts, sequence diagrams, or block diagrams may be re-ordered, processed serially, or processed concurrently consistent with embodiments of the invention. Moreover, any of the flowcharts, sequence diagrams, or block diagrams may include more or fewer blocks than those illustrated consistent with embodiments of the invention. It should also be understood that each block of the block diagrams or flowcharts, or any combination of blocks in the block diagrams or flowcharts, may be implemented by a special purpose hardware-based system configured to perform the specified functions or acts, or carried out by a combination of special purpose hardware and computer instructions.

While all the invention has been illustrated by a description of various embodiments, and while these embodiments have been described in considerable detail, it is not the intention of the Applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the Applicant's general inventive concept.

The invention claimed is:

1. A method of processing a printed circuit board including an epoxy-based composite material, comprising:
   exposing the printed circuit board to a swelling agent until the epoxy has swollen sufficiently to disintegrate into swelled epoxy particles at least a portion of which are suspended in the swelling agent; and
   separating the swelled epoxy particles from a remaining portion of the printed circuit board,
   wherein the swelling agent includes an effective amount of at least one of formic acid and acetic acid, and separating the swelled epoxy particles from the remaining portion of the printed circuit board includes filtering the suspended particles from the swelling agent.

2. The method of claim 1, wherein separating the swelled epoxy particles from the remaining portion of the printed circuit board includes vibrating the printed circuit board.

3. The method of claim 2, wherein the printed circuit board is vibrated proximate to a sieve screen configured to allow the swelled particles of epoxy to fall through and to retain at least a part of the remaining portion of the printed circuit board.

4. The method of claim 1, further comprising:
   comminuting the printed circuit board into a plurality of pieces.

5. The method of claim 4, wherein comminuting the printed circuit board into the plurality of pieces includes one or more of cutting, grinding, or pulverizing the printed circuit board.

6. The method of claim 4, wherein exposing the printed circuit board to the swelling agent includes immersing the plurality of pieces in the swelling agent.

7. The method of claim 1, wherein exposing the printed circuit board to the swelling agent includes one or more of heating the swelling agent, pressurizing the swelling agent, and agitating the swelling agent.

8. The method of claim 1, wherein the swelling agent further includes one or more of a solvent, a surfactant, and a complexing agent.

9. The method of claim 1, further comprising:
   extracting glass fibers from the remaining portion of the printed circuit board.

10. The method of claim 9, wherein extracting the glass fibers includes:
    inserting a multi-pronged tool into the remaining portion of the printed circuit board; and
    rotating the tool.

11. The method of claim 1, further comprising:
    extracting a metal from the remaining portion of the printed circuit board.

12. The method of claim 11, wherein the metal extracted includes a base metal, and extracting the base metal from the remaining portion of the printed circuit board includes:
    exposing the printed circuit board to a general acid; and
    extracting the base metal from the general acid,
    wherein the general acid includes one or more of hydrochloric acid, nitric acid, sulfuric acid, and phosphoric acid.

13. The method of claim 11, wherein extracting the metal from the remaining portion of the printed circuit board includes:
    exposing the printed circuit board to an eddy current separator configured to separate a first metal from a second metal.

14. The method of claim 11, wherein extracting the metal from the remaining portion of the printed circuit board includes extracting the metal from the swelling agent.

15. The method of claim 14, wherein the metal is extracted from at least one of the formic acid or the acetic acid of the swelling agent.

16. The method of claim 1, wherein the swelling agent includes the formic acid in a concentration of at least 20% by volume.

17. A method of processing a printed circuit board including an epoxy-based composite material, comprising:
    exposing the printed circuit board to a swelling agent until the epoxy has swollen sufficiently to disintegrate into swelled epoxy particles;
    separating the swelled epoxy particles from a remaining portion of the printed circuit board;

draining the swelling agent from a processing chamber containing the printed circuit board;

filtering the swelling agent; and returning the swelling agent to a swelling agent tank used to supply the swelling agent to the processing chamber, wherein the swelling agent includes an effective amount of at least one of formic acid or acetic acid.

18. A method of processing a printed circuit board including an epoxy-based composite material, comprising:

exposing the printed circuit board to a swelling agent until the epoxy has swollen sufficiently to disintegrate into swelled epoxy particles;

separating the swelled epoxy particles from a remaining portion of the printed circuit board;

extracting a noble metal from the remaining portion of the printed circuit board by:
 exposing the printed circuit board to a noble metal solution; and
 extracting the noble metal from the noble metal solution, wherein the swelling agent includes an effective amount of at least one of formic acid or acetic acid, and the noble metal solution is one of aqua regia or a cyanide salt solution.

19. The method of claim 18, wherein at least a portion of the swelled epoxy particles are suspended in the swelling agent, and separating the swelled epoxy particles from the remaining portion of the printed circuit board includes filtering the particles from the swelling agent.

* * * * *